(12) United States Patent
Aleksov et al.

(10) Patent No.: US 11,348,882 B2
(45) Date of Patent: May 31, 2022

(54) PACKAGE SPARK GAP STRUCTURE

(71) Applicant: Intel Corporation, Santa Clara, CA (US)

(72) Inventors: Aleksandar Aleksov, Chandler, AZ (US); Feras Eid, Chandler, AZ (US); Johanna M. Swan, Scottsdale, AZ (US); Adel A. Elsherbini, Chandler, AZ (US); Veronica Aleman Strong, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 260 days.

(21) Appl. No.: 16/683,125

(22) Filed: Nov. 13, 2019

(65) Prior Publication Data

US 2021/0143111 A1     May 13, 2021

(51) Int. Cl.
*H01L 23/60*    (2006.01)
*H01L 23/498*   (2006.01)
*H01L 23/053*   (2006.01)
*H01L 23/00*    (2006.01)

(52) U.S. Cl.
CPC ........... *H01L 23/60* (2013.01); *H01L 23/053* (2013.01); *H01L 23/49827* (2013.01); *H01L 24/16* (2013.01); *H01L 2224/16235* (2013.01)

(58) Field of Classification Search
CPC . H01L 23/60; H01L 23/49827; H01L 23/053; H01L 24/16; H01L 2224/16235; H01L 24/13; H01L 2224/13111; H01L 2224/13139; H01L 2224/13147; H01L 2924/15174; H01L 2224/16225; H01L 2924/15311; H01L 2924/14
See application file for complete search history.

(56) References Cited

U.S. PATENT DOCUMENTS

| 7,872,346 | B1 | 1/2011 | Chee et al. |
| 9,380,688 | B1 | 6/2016 | Feng et al. |
| 2006/0002047 | A1 | 1/2006 | Cheung et al. |
| 2008/0266730 | A1* | 10/2008 | Viborg ............ H01T 4/08 361/56 |
| 2015/0138827 | A1 | 5/2015 | Song et al. |
| 2019/0293692 | A1 | 9/2019 | Clarke et al. |

OTHER PUBLICATIONS

PCT—Jan. 12, 2021—International Search Report and Written Opinion of the International Searching Authority for International Application No. PCT/US2020/052622; 10 pages.

* cited by examiner

*Primary Examiner* — Elias Ullah
(74) *Attorney, Agent, or Firm* — Patent Capital Group

(57) ABSTRACT

Embodiments may relate to a microelectronic package with an electrostatic discharge (ESD) protection structure within the package substrate. The ESD protection structure may include a cavity that has a contact of a signal line and a contact of a ground line positioned therein. Other embodiments may be described or claimed.

20 Claims, 14 Drawing Sheets

PACKAGE SPARK GAP STRUCTURE

BACKGROUND

One concern for microelectronic packages is electrostatic discharge (ESD). ESD may refer to a sudden onset of charge transfer (i.e., electron flow) between two objects with different electric potentials. These static voltages may cause partial to full breakdown of an integrated circuit (IC) of the microelectronic package.

DETAILED DESCRIPTION

Figure 1:
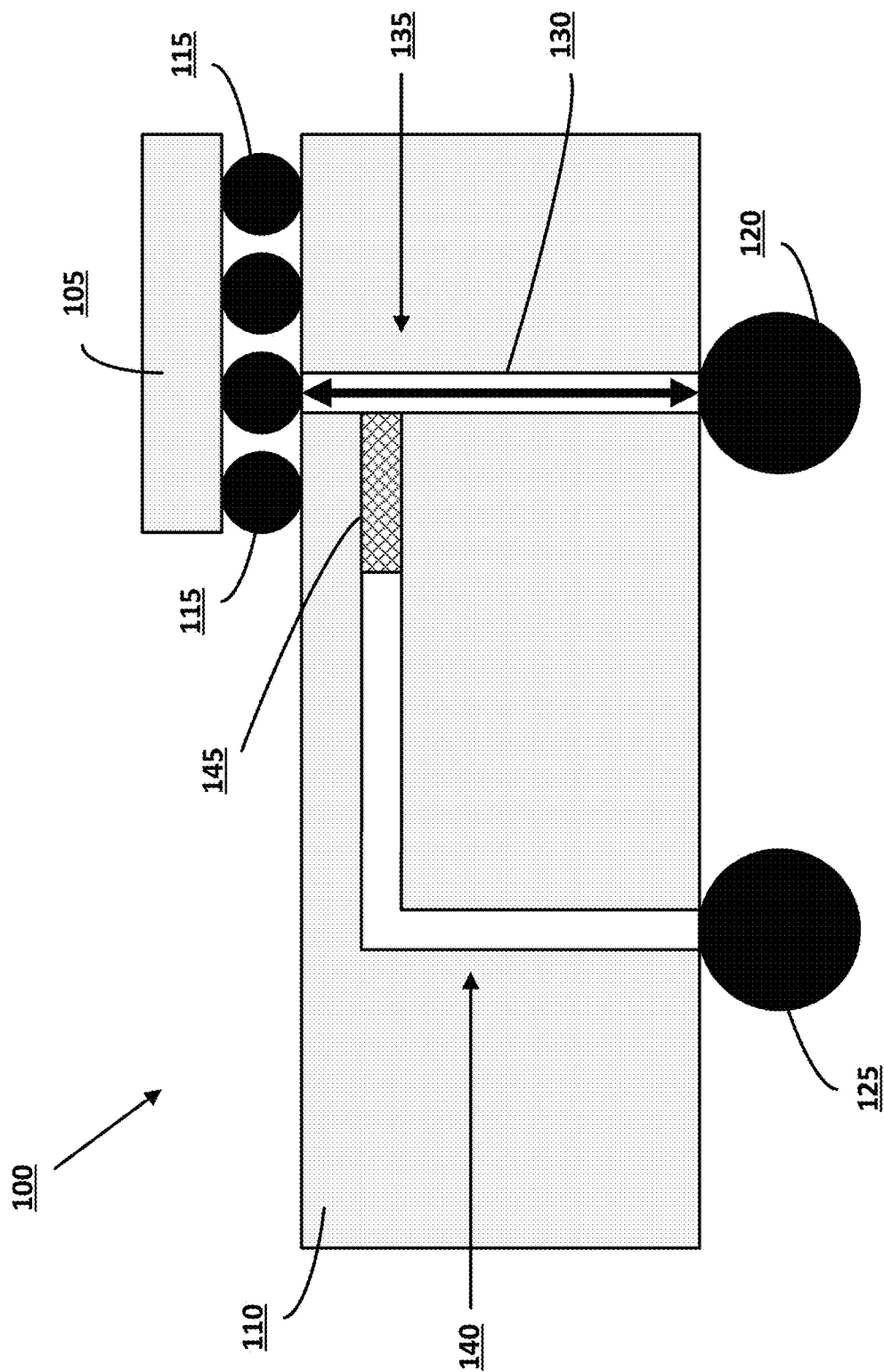
FIGS. 1 and 2 depict an example microelectronic package with an ESD protection structure with a spark gap, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature on a second feature," may mean that the first feature is formed/deposited/disposed/etc. over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an application specific integrated circuit (ASIC), an electronic circuit, a processor (shared, dedicated, or group) or memory (shared, dedicated, or group) that execute one or more software or firmware programs, a combinational logic circuit, or other suitable components that provide the described functionality.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise. Additionally, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined, e.g., using scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

It will be understood that the term "microelectronic package" may, in other situations, be referred to as a "semiconductor package." However, the term "microelectronic package" will be used herein for the sake of consistency.

As noted, ESD may be undesirable in a microelectronic package because it may cause partial to full breakdown of ICs of the microelectronic package, even when the ICs are only exposed to the static voltages for a relatively short period of time. Hence, ESD protection may be viewed as a reliability concern and an important element of any electronic system, especially when IC costs are considered.

Generally, innovation into ESD protection may be desired to keep up with the ongoing trend of shrinking IC sizes and the increased number of high-speed signal lines or higher operating frequencies. This trend may result in a desire for minimizing the IC area that is dedicated to ESD protection features on-die (such as on-die diodes). It may therefore be desirable to offload some of the ESD protection features from the die and integrate them in the package as an embedded package solution in next-generation packaging technologies.

Generally, embodiments herein relate to use of an ESD protection structure with a spark gap. The spark gap may be based on the electrical breakdown of air, and may be designed to have minimal sensitivity to humidity over the operating range of interest. In some embodiments, the spark gap may be dependent on air density (i.e., the temperature if the air is allowed to freely escape when heated). Therefore, some embodiments may relate to a way to miniaturize and contain the spark gap in a defined volume integrated in the package substrate and made by using package and assembly structures. Embodiments may therefore exhibit discharge at a stable voltage that is controlled by the distance between the electrodes that define the spark gap. Aspects of the ESD protection structure may be identified to minimize capacitive loading of the signal line, which in turn may minimize disruption to signaling in the microelectronic package. For example, the electrodes of the ESD protection structure may have a "pointed" type profile, and the dielectric within the ESD protection structure may be air.

Embodiments may provide a number of advantages over legacy microelectronic packages. For example, package-integrated ESD structures may reduce the need for on-die ESD diodes, which in turn may allow for more use of on-die silicon area. Specifically, the spark-gap structures may require minimal design changes to the microelectronic package, and minimal additions to substrate package manufacturing, which may reduce or minimize the added cost to the package substrate that includes these structures. The structures may be permanently present, thus enabling ESD not only during assembly, but throughout the lifetime of the product.

Figure 2:
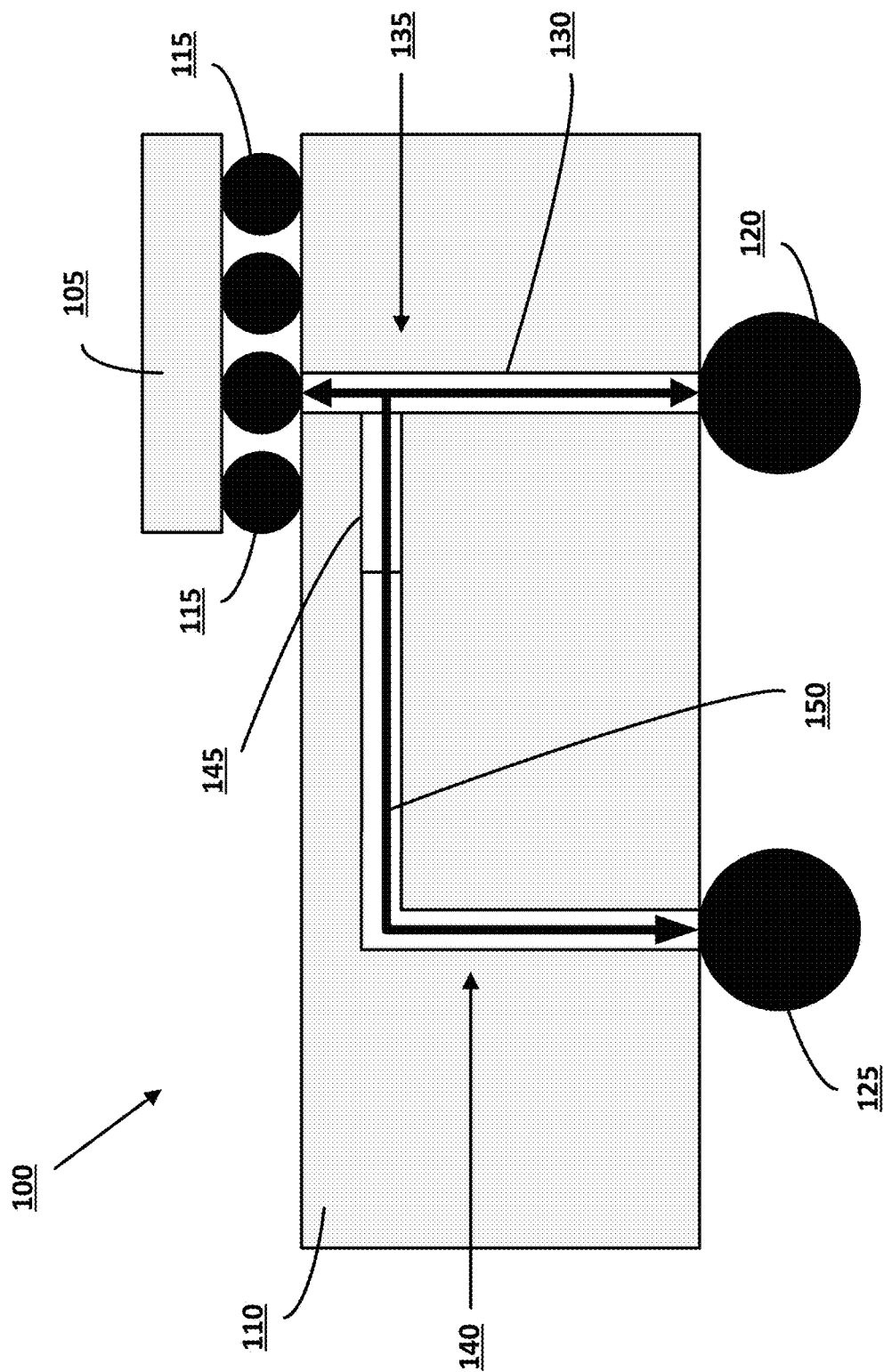

FIGS. 1 and 2 depict an example microelectronic package 100 with an ESD protection structure 145, in accordance with various embodiments. Generally, the package 100 may include a die 105 coupled with a package substrate 110. The die 105 may be or include, for example, a processor such as a central processing unit (CPU), general processing unit, a core of a distributed processor, or some other type of processor. Alternatively, the die 105 may be or include a memory such as a double data rate (DDR) memory, a nonvolatile memory (NVM), a volatile memory, a read-only memory (ROM), or some other type of memory or die. In some embodiments the die 105 may be or include a radio frequency (RF) chip or RF circuitry that is configured to generate, process, transmit, or receive a wireless signal such as a third generation (3G), a fourth generation (4G), a fifth generation (5G), a Wi-Fi, or some other type of wireless signal. In some embodiments the die 105 may include one or more passive components such as capacitors, resistors, etc. The various active or passive components may be positioned within, partially within, or on the surface of the die 105.

The package substrate 110 may be, for example, considered to be a cored or coreless substrate. The package substrate 110 may include one or more layers of a dielectric material which may be organic or inorganic. The package substrate 110 may further include one or more conductive elements such as vias, pads, traces, microstrips, striplines, etc. The conductive elements may be internal to, or on the surface of, the package substrate. Generally, the conductive elements may allow for the routing of signals through the package substrate 110, or between elements that are coupled to the package substrate 110. In some embodiments the package substrate 110 may be, for example, a printed circuit board (PCB), an interposer, a motherboard, or some other type of substrate. It will be understood that although the package substrate 110 is discussed herein as an element of the microelectronic package 100, in other embodiments the package substrate 110 may be considered to be an element separate from the microelectronic package 100 to which the microelectronic package 100 is coupled.

The die 105 may be coupled with the package substrate 110 by one or more interconnects 115. The interconnects 115 may be, for example, C4 (controlled collapse chip), or flip-chip, bumps that are formed of a material such as tin, silver, copper, etc. Generally, the interconnects 115 may physically or communicatively couple the die 105 with the package substrate 110. For example, one or more of the interconnects 115 may physically couple with, and allow electrical signals to pass between, pads of the die 105 and pads of the package substrate 110 (not shown for the sake of elimination of clutter of FIGS. 1 and 2). In other embodiments, one or more of the interconnects 115 may physically couple the die 105 and the package substrate 110, but the interconnects 115 may not communicatively couple the die 105 and the package substrate 110.

The microelectronic package 100 may further include a plurality of interconnects such as interconnects 120 and 125. The interconnects 120 and 125 may be formed of a material such as tin, copper, silver, etc. Specifically, the interconnects 120/125 may be elements of a ball grid array (BGA), pin grid array (PGA), land grid array (LGA), etc. The interconnects 120/125 may communicatively or physically couple the microelectronic package 100 to another element of an electronic device such as a PCB, a motherboard, an interposer, etc.

More specifically, the interconnect 120 may communicatively couple the microelectronic package 100 with a voltage input. The voltage input may be, for example, a power source, a communicative pathway (e.g., a signal line or a power line), or some other element of an electronic device of which the microelectronic package 100 is a part. Specifically, the voltage input may provide an electrical signal 130 with an input voltage $V_{in}$. The interconnect 125 may communicatively couple the microelectronic package 100 with a ground. The ground may be, for example, a ground plane of the electronic device or some other ground.

As noted above, the substrate 110 of the microelectronic package 100 may include a number of conductive elements such as vias, traces, microstrips, striplines, pads, etc. The conductive elements may form a number of signal/electronic pathways through the substrate 110. One such pathway is signal path 135. The signal path 135 may allow for the electrical signal 130 to travel between the interconnect 120 and the die 105. The electrical signal 130 may be, for example, a data signal, a power signal, or some other type of electrical signal.

The substrate 110 may further include a ground path 140. The ground path 140 may be coupled with the interconnect 125 and, through interconnect 125, to ground. In some embodiments, the ground path 140 may be referred to as a "shunt" to ground.

The ground path 140 and the signal path 135 may be communicatively coupled by an ESD protection structure 145. As can be seen, the ESD protection structure 145 may be communicatively located between the ground path 140 and the signal path 135. The specific makeup of the ESD protection structure 145 may be discussed in greater detail below, however, at a high level the ESD protection structure 145 may behave as an insulator at low voltages, and be conductive at relatively high voltages. Specifically, the ESD protection structure 145 may have a voltage threshold referred to herein as $V_{trigger}$. If $V_{in}$ is below (or, in some embodiments, at or below) $V_{trigger}$, then the ESD protection structure 145 may be insulative and not allow electrical signals to flow between the signal path 135 and the interconnect 125. An example of such an insulative state is shown in FIG. 1.

However, if $V_{in}$ is above (or, in some embodiments, at or above) $V_{trigger}$, then the ESD protection structure 145 may switch to a conductive state. An example of such a conductive state is shown in FIG. 2. Specifically, at least a portion of the electrical signal 130 may still traverse through the signal path 135. However, a portion 150 of the electrical signal may also be shunted to ground through the ground path 140.

In operation, $V_{trigger}$ may be set to a level that is above the level at which a data or power signal may desirably traverse along the signal path 135. However, it may also be desirable for $V_{trigger}$ to be at a level that is below a voltage level at which ICs of the die 105 may become damaged. More specifically, it may be desirable for $V_{trigger}$ to be at a level that is below the voltage level which may be present in an ESD event. As such, if ESD occurs, then $V_{in}$ may become greater than (or equal to, in some embodiments) $V_{trigger}$, and so the ESD protection structure 145 may become conductive and at least a portion of the voltage from the ESD may shunt to ground through the ground path 140. However, if there is no ESD event, then $V_{in}$ may be below (or equal to, in some embodiments) $V_{trigger}$ and so electrical communication along the signal path 135 may occur as normal.

Generally, it may be desirable for $V_{trigger}$ to be less than or equal to a few volts (e.g. between approximately 2 and approximately 10 volts (V), or more specifically between approximately 4 and approximately 5 V.) However, it will be understood that these are example ranges and the $V_{trigger}$ level of other embodiments may vary. Such variation may be based on, for example, the specific use case to which the microelectronic package may be put, specific properties of the die 105, properties of the ICs of the die 105, or other material or design considerations. More specifically, $V_{trigger}$ may be based on or derived from the specific structure of the ESD protection structure, as will be discussed in greater detail below with respect to FIG. 7.

It will be understood that the above-described FIGS. 1 and 2 are intended as examples, and other embodiments may vary with respect to number of elements, specific configurations, etc. For example, it will be understood that the signal path 135 and the ground path 140 are highly simplified examples, and other embodiments may include additional conductive elements such as pads, traces, etc. Similarly, the relative sizes, shapes, or number of the paths, the dies, the interconnects, etc. may be different in other embodiments. For example, some embodiments may have additional dies 105, additional interconnects 115/120/125, additional signal paths 135 or ground paths 140, additional ESD protection structures 145, etc., or one or more of those elements in a location that is different than the location depicted in FIG. 1 or 2. Other variations may be present in other embodiments.

Figure 3:
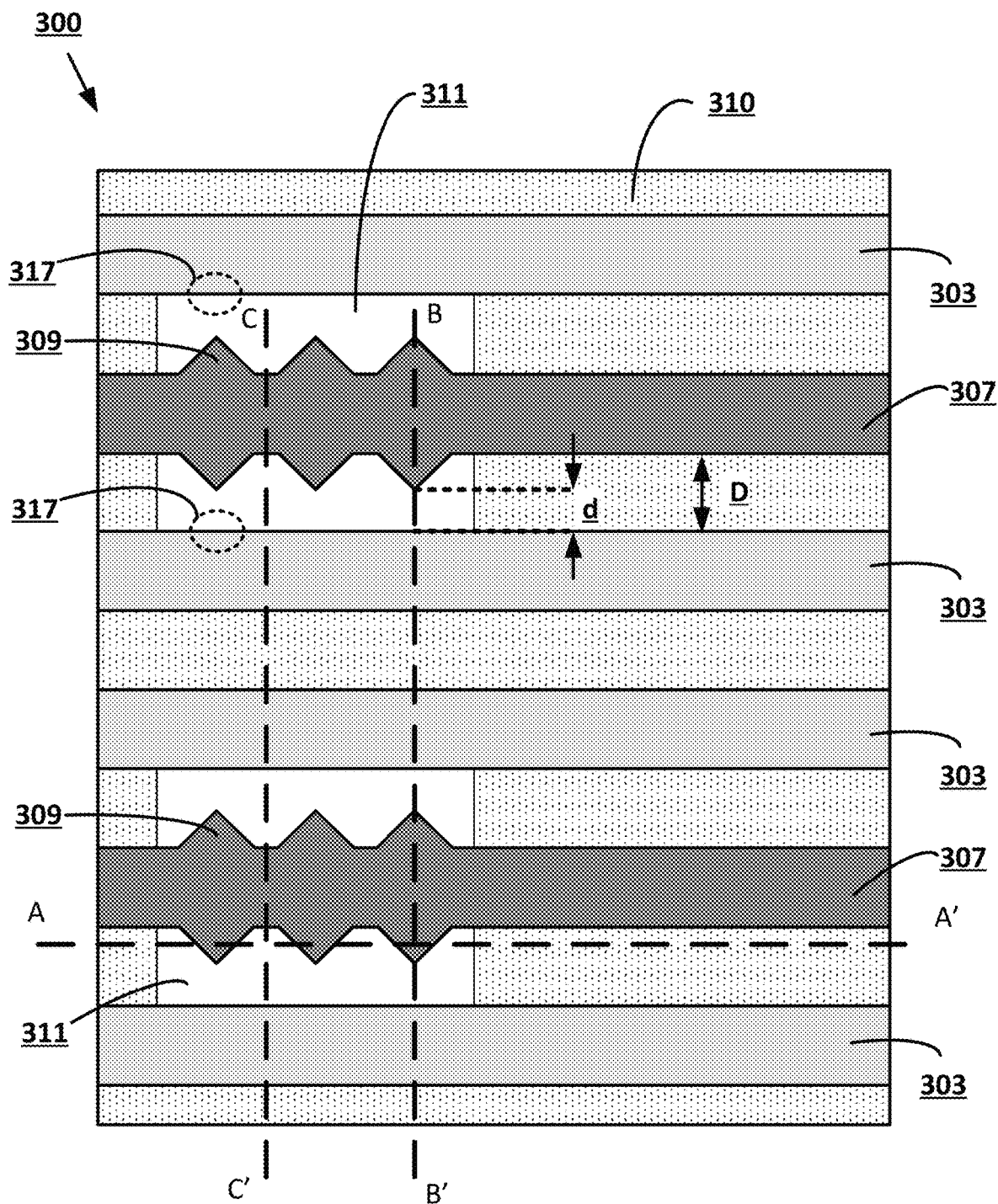
FIG. 3 depicts a simplified top-down view of an example ESD protection structure with a spark gap, in accordance with various embodiments.
Figure 4:
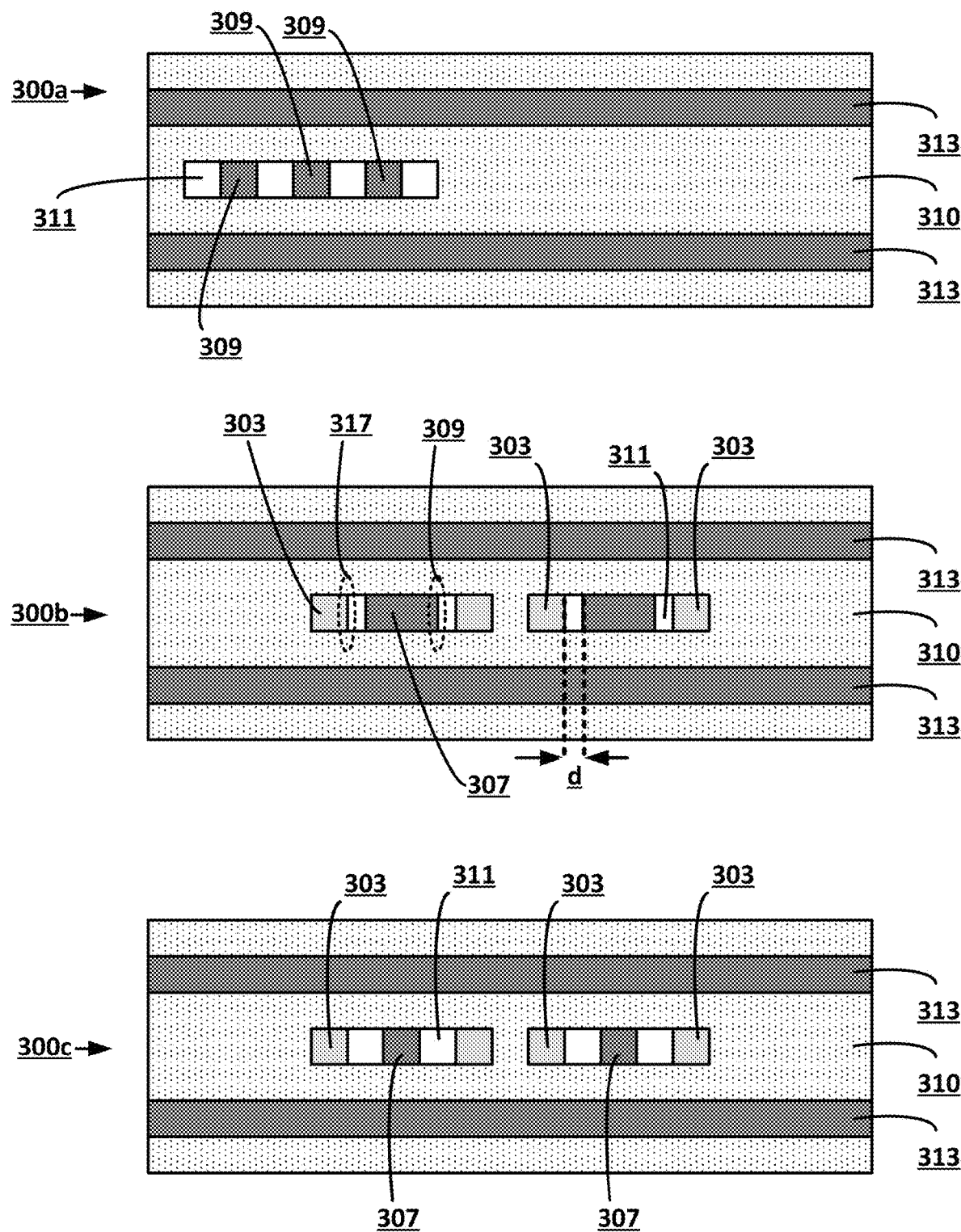
FIG. 4 depicts simplified cross-sectional views of the example ESD protection structure of FIG. 3, in accordance with various embodiments.
Figure 5:
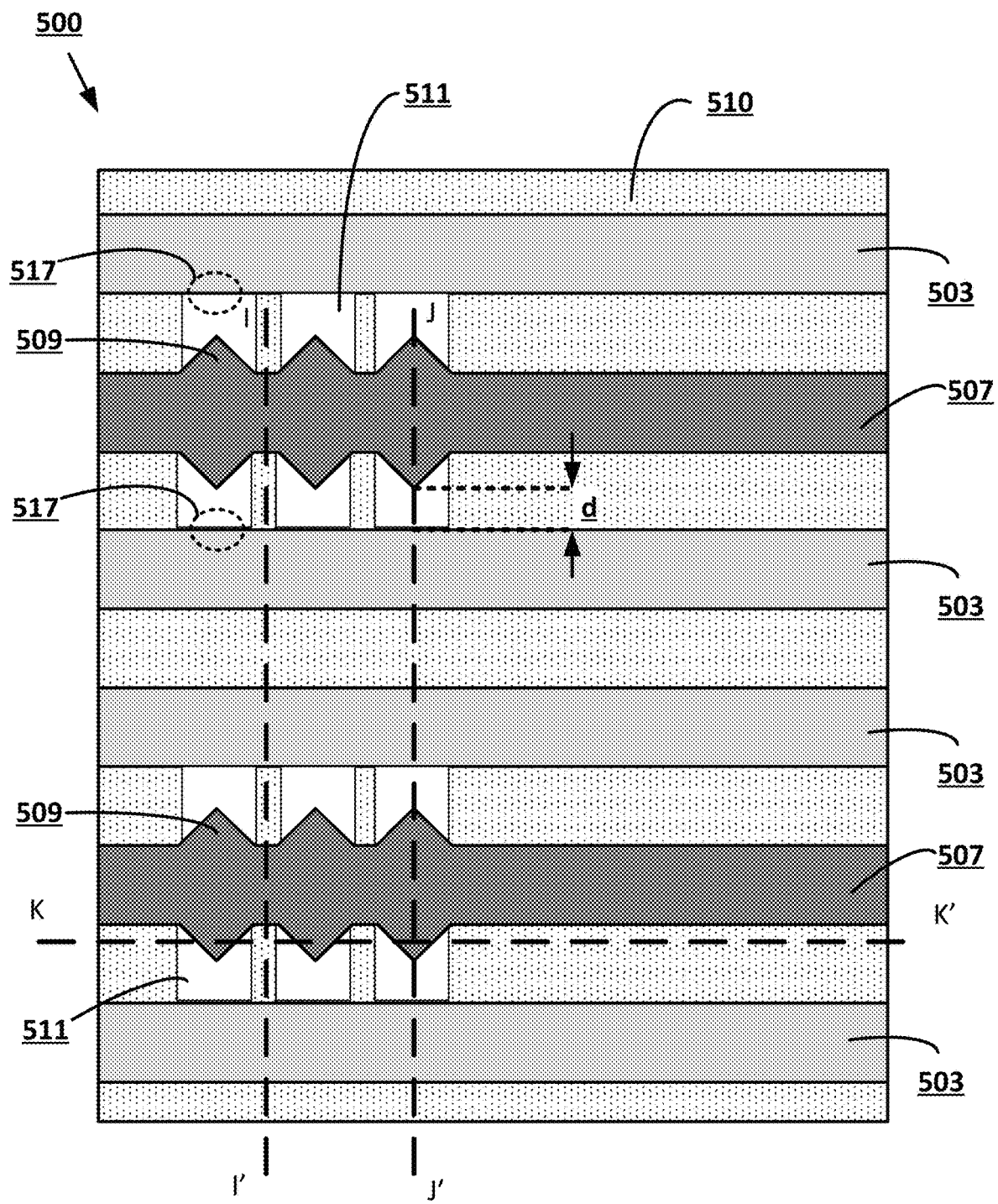
FIG. 5 depicts a simplified top-down view of an alternative example ESD protection structure with a spark gap, in accordance with various embodiments.
Figure 6:
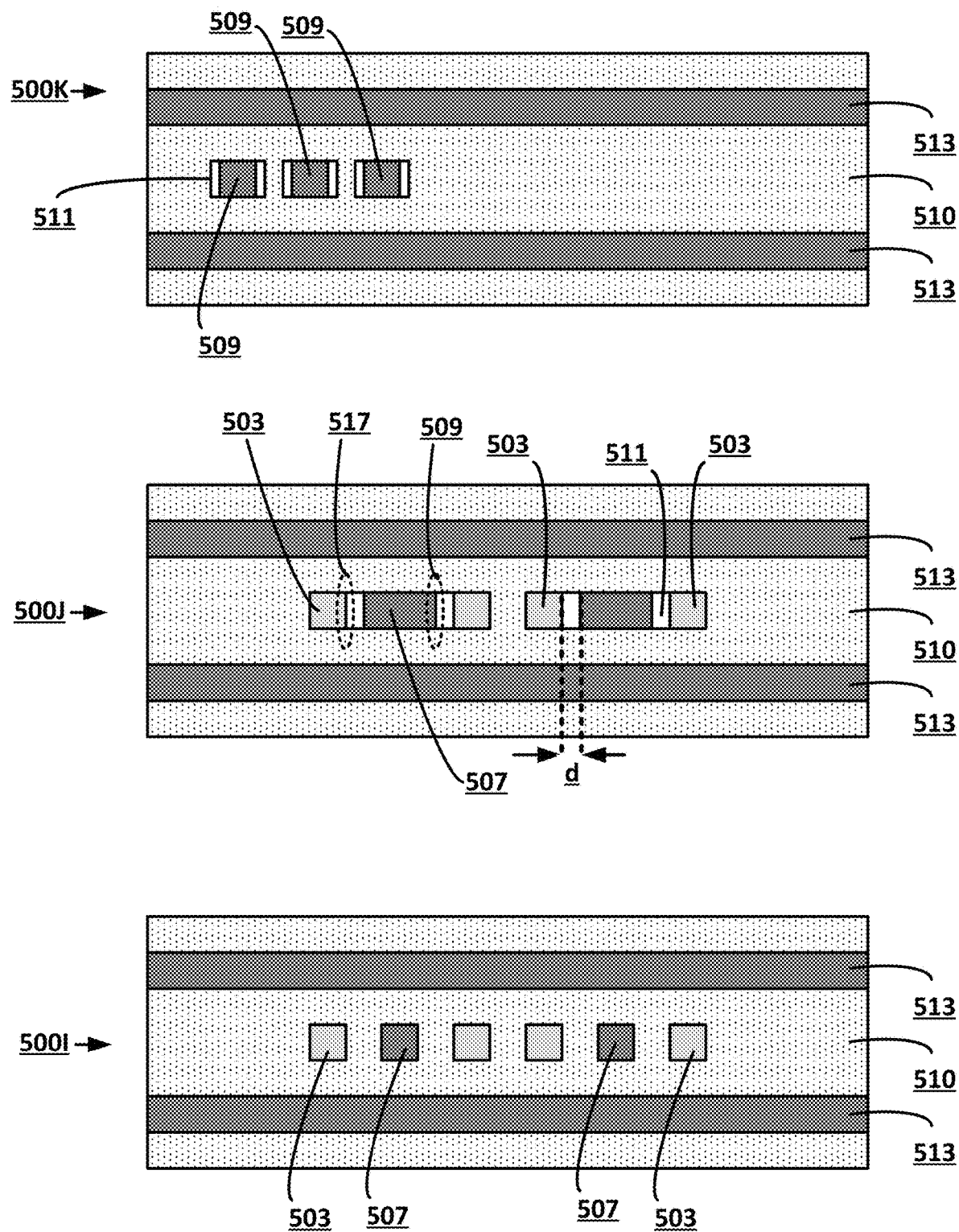
FIG. 6 depicts simplified cross-sectional views of the example ESD protection structure of FIG. 5, in accordance with various embodiments.

Details of possible embodiments are depicted in FIGS. 3-6. Specifically, FIGS. 3 and 4 illustrate one embodiment with larger airgaps, where each airgap encompasses several spark-gap structures. FIGS. 5 and 6 illustrate similar structures, however each spark-gap structure may have its own air gap (i.e., with significantly smaller air gaps).

Specifically, FIG. 3 depicts a simplified top-down view of an example ESD protection structure with a spark gap, in accordance with various embodiments. More specifically, FIG. 3 depicts a top-down view of a layer of a package substrate 310 in a microelectronic package 300. FIG. 4 depicts simplified cross-sectional views of the example ESD protection structure of FIG. 3, in accordance with various embodiments. Specifically, view 300A may be a view along line A-A' of the microelectronic package 300 of FIG. 3. View 300B may be a view along line B-B' of the microelectronic package 300 of FIG. 3. View 300C may be a view along line C-C' of the microelectronic package 300 of FIG. 3.

The package substrate 310 and microelectronic package 300 may be similar to, and share one or more characteristics with, package substrate 110 and microelectronic package 100. The package substrate 310 may include a number of signal lines 303 and a number of ground lines 307.

A signal line 303 may be, for example, a trace, a microstrip, a stripline, etc. that is formed of a conductive material such as copper, gold, or some other conductive material. Specifically, the signal line 303 may be an element of the signal path 135 that is communicatively coupled to, and positioned between die 105 and interconnect 120 (which may be referred to herein as a signal interconnect). The signal line 303 may be configured to convey data signals, power signals, or some other type of signal between the die 105 and the interconnect 120.

Similarly to the signal line 303, the ground line 307 may be, for example, a trace, a microstrip, a stripline, etc. that is formed of a conductive material such as copper, gold, or some other conductive material. Specifically, the ground line 307 may be an element of the ground path 140 that is communicatively coupled with interconnect 125 (which may be referred to herein as a ground interconnect).

The package substrate 310 may include a cavity 311 that includes at least a portion of both the ground line 307 and the signal line 303 therein. Generally, the cavity 311 may be a sealed cavity that is filled with air. However, in other embodiments, the cavity 311 may be filled with some other dielectric material such as an inert gas, a solid dielectric, or some other material or combination of materials.

The ground line 307 may include a number of ground contacts 309, which are depicted in FIG. 3 as generally triangular elements positioned within the cavity 311 as part of the ground line 307. The signal line 303 may also include a signal contacts 317 that is opposite the ground contact 309.

In the embodiment shown in FIG. 3, the signal contact 317 may be a portion of the signal line 303 that is opposite the ground contact 309. In other embodiments, the signal contact may include an additional structure (e.g., a protrusion similar to ground contact 309), a pad formed of a different material, or some other type of contact. Generally, the cavity 311, ground contact(s) 309, and signal contact(s) may form or be part of an ESD protection structure such as ESD protection structure 145.

As can be seen in FIG. 4, the cavity 311, the ground line 307, the signal line 303, the ground contact 309, and the signal contact 317 may be generally coplanar. Additionally, the layer may be positioned between two metal layers 313 which may provide electromagnetic interference (EMI) protection to, or from, the ESD protection structure.

As can be seen in FIGS. 3 and 4, the ground contact 309 and the signal contact 317 may be positioned a distance d apart from one another, while the ground line 307 and the signal line are positioned a distance D apart from one another. The distance D may be between approximately 5 and approximately 25 microns (though the distance may vary in other embodiments based on factors such as design considerations, material selection, etc.)

The distance d may be a distance that is based on a desired trigger voltage $V_{trigger}$. For example, a smaller distance d may provide for a lower $V_{trigger}$. By contrast, a higher distance d may provide for a higher $V_{trigger}$. When $V_{in}$ is at or above $V_{trigger}$, then extra charge may spark between the ground contact(s) 309 and the signal contact(s) 317 as described above with respect to FIGS. 1 and 2. This spark may generate an electromagnetic field which may interfere with or otherwise damage other elements or circuits of the microelectronic package 300, and so it may be desirable to place the metal layers 313 on either side of the ESD protection structure to prevent or minimize the effects of that spark.

FIGS. 5 and 6 depict an alternative example ESD protection structure with a spark gap. More specifically, FIG. 5 depicts a top-down view of a layer of a package substrate 510 in a microelectronic package 500 FIG. 6 depicts simplified cross-sectional views of the example ESD protection structure of FIG. 5, in accordance with various embodiments. Specifically, view 500K may be a view along line K-K' of the microelectronic package 500 of FIG. 5. View 500J may be a view along line J-J' of the microelectronic package 500 of FIG. 5. View 500I may be a view along line I-I' of the microelectronic package 500 of FIG. 5.

The microelectronic package 500 may include several elements that are similar to, and share one or more characteristics with, the microelectronic package 300. Specifically, the microelectronic package 500 may include a package substrate 510, signal contacts 517, signal lines 503, ground lines 507, ground contacts 509, and metal layers 513 which may be respectively similar to, and share one or more characteristics with, package substrate 310, signal contacts 317, signal lines 303, ground lines 307, ground contacts 309, and metal layers 313. Although not marked, the signal lines 503 and the ground lines 507 may be positioned a distance D apart from one another as described above with respect to FIG. 3.

The microelectronic package 500 may further include a plurality of cavities 511, which may be similar to, and share one or more characteristics with, cavities 311 of the microelectronic package 300. However, as can be seen the cavities 511 may be smaller than cavities 311 and may include a single ground contact 509 rather than a plurality of ground contacts as depicted in FIGS. 3 and 4 with respect to microelectronic package 300. It may be desirable to have the smaller air cavities 511 rather than a single large air cavity 311 because the smaller air cavities 511 may allow for individual tuning of the voltage $V_{trigger}$ for each of the spark gaps between ground contacts 509 and signal contacts 517. In other embodiments, the smaller air cavities 511 may be desirable because they may be easier to manufacture than a single large cavity.

It will be understood that the embodiments of FIGS. 3-6 are intended as example embodiments, and other embodiments may have a cavity such as cavities 311 or 511 may span more or fewer signal or ground lines than are depicted, or the signal or ground lines may be arranged differently.

Additionally, the embodiments of FIGS. 3-6 depict ground lines 307 or 507 with three ground contacts 309/509 on each side of the ground lines. However, in other embodiments the ground lines may have more or fewer ground contacts than are depicted. In some embodiments, the protruding contacts depicted as ground contacts 309/509 may not be on the ground line, rather the ground line may be relatively smooth and the signal lines 303/503 may have protruding contacts. In some embodiments both the ground lines 307/507 and the signal lines 303/503 may have protruding contacts. Additionally, even though the ground contacts 309/509 are depicted as being generally symmetrical on either side of the ground lines 307/507, in some embodiments the ground contacts 309/509 may be offset from one another with respect to the ground line such that the ground line and ground contacts form a sawtooth-type profile instead of a diamond-type profile as depicted in FIGS. 3 and 5. In some embodiments, different ones of the ground contacts 309/509 may have different distances from a respective signal contact 317/517. The different distances may allow for different trigger voltages $V_{trigger}$, which may be desirable to tune the performance of the ESD protection structure.

It will also be noted that, as shown in FIGS. 4 and 6, the cavities 311/511 may generally have the same height as the height of a metal layer (e.g., the ground lines 307/507 or the signal lines 303/503). However, in other embodiments a cavity may have a height between approximately half the height of a metal layer to taller than the height of a metal layer. For example, in some embodiments a cavity may extend between one or both of the metal layers such as metal layers 313 and 513.

Figure 7:
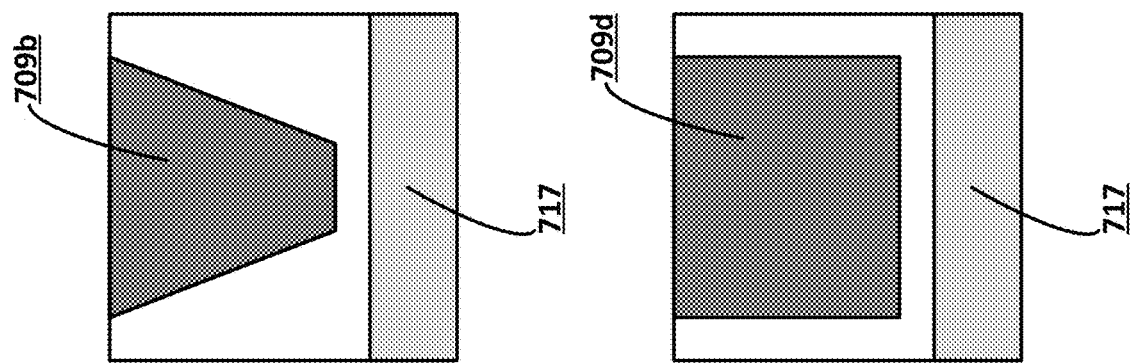
FIG. 7 depicts various examples of spark gaps of an ESD protection structure, in accordance with various embodiments.
Figure 7:
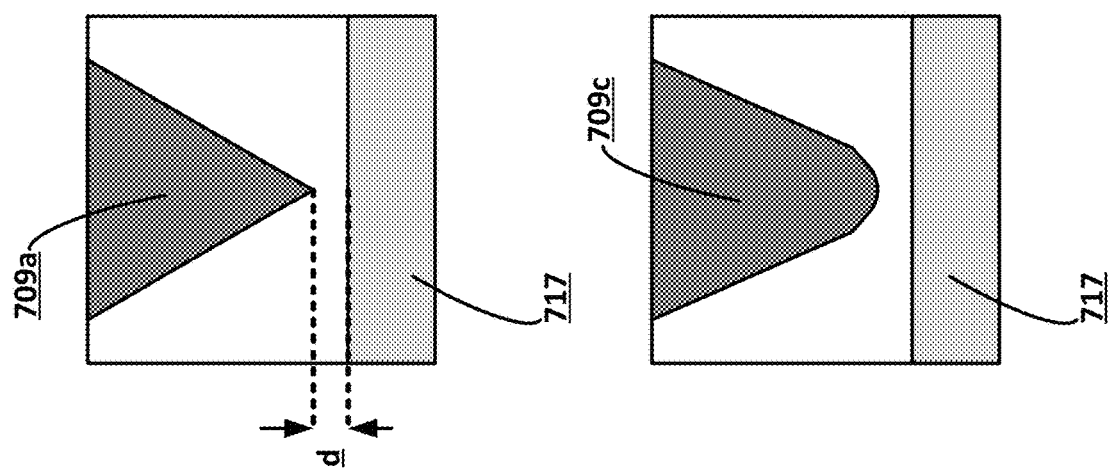

FIG. 7 illustrates details of the actual spark gap. The spark gap may have different shapes as illustrated. Specifically, FIG. 7 depicts various examples of spark gaps of an ESD protection structure, in accordance with various embodiments.

As can be seen, FIG. 7 depicts different ground contacts 709a, 709b, 709c, and 709d. The ground contacts 709a-d may be similar to, and share one or more characteristics with, ground contacts 309 or 509. The ground contacts 709a-d are shown as adjacent to signal contacts 717, which may be similar to, and share one or more characteristics with, signal contacts 317 or 517. As can be seen, the various ground contacts 709a-d may be separated from the signal contact 717 by a distance d as discussed above.

The distance d may generally determine at which voltage, $V_{trigger}$, the spark will be triggered. To trigger a spark at approximately 4V, assuming a standard breakdown-field of air of about 3 kilovolts per millimeter (kV/mm), the distance d may be on the order of approximately 1.5 micrometers ("microns"). However, in other embodiments the distance d may more generally be between approximately 0.5 and approximately 5 microns.

As can be seen in FIG. 7, different of the ground contacts 709a-709d may have different profiles. For example, ground contact 709a may have a generally triangular and pointed profile. Ground contact 709b may have a trapezoidal profile. Ground contact 709c may have a rounded profile. Ground contact 709d may have a squared-off profile. The different profiles may be desirable for different reasons. For example, ground contact 709a may have a reduced voltage $V_{trigger}$ as compared to, for example, ground contact 709d.

It will be understood that these example profiles are intended as examples, and various embodiments may have different profiles. The specific profile to be used may be identified based on, for example, specific manufacturing considerations, the use case to which the microelectronic package may be put, or other considerations. Additionally, it will be understood that even though the depicted elements are discussed herein as "ground contacts" in some embodiments a signal line may include one or more protruding signal contacts with a profile similar to those described above with respect to the ground contacts 709a-709d.

Figure 8:
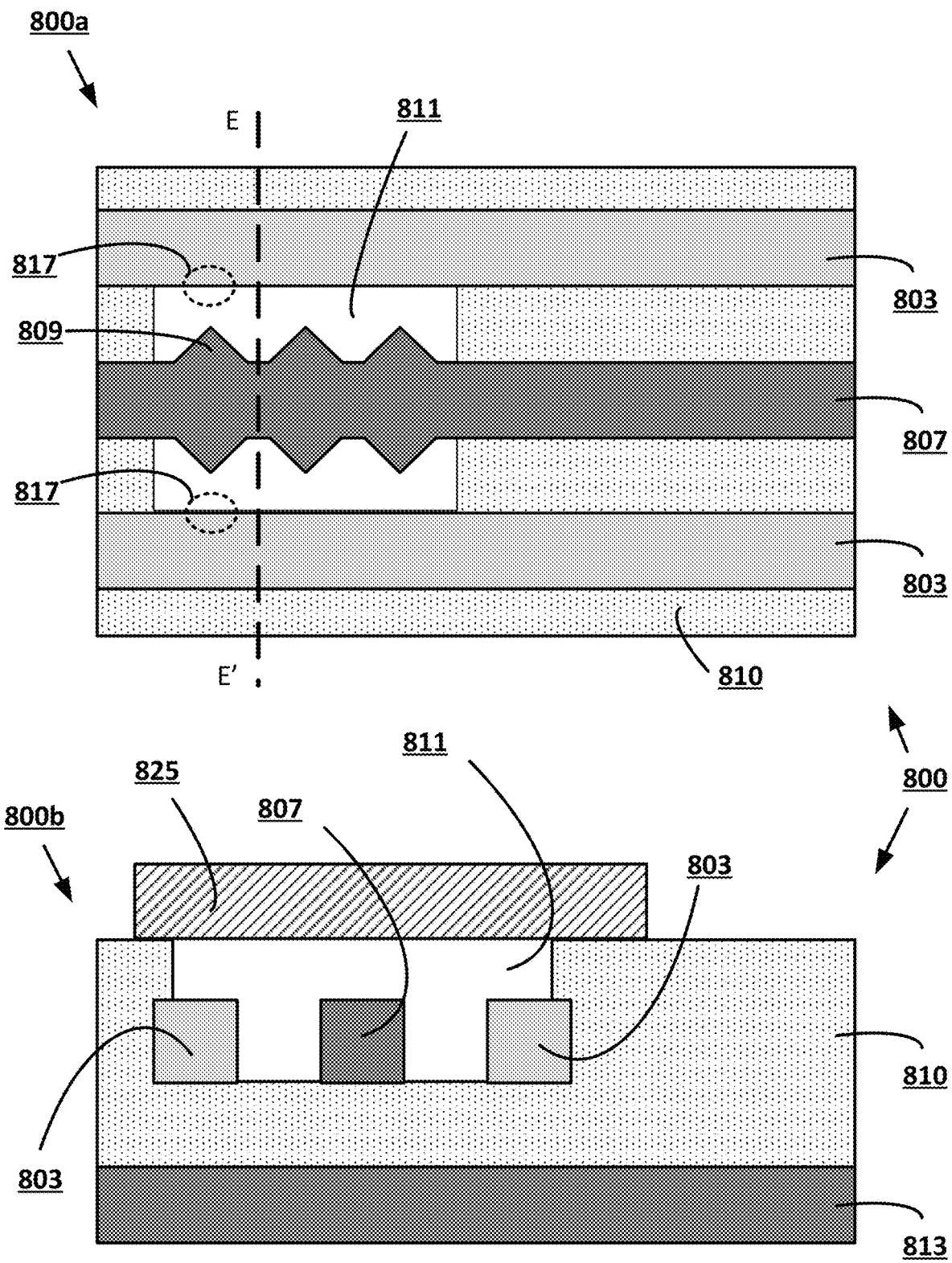
FIG. 8 depicts various simplified views of an alternative example ESD protection structure with a spark gap, in accordance with various embodiments.
Figure 9:
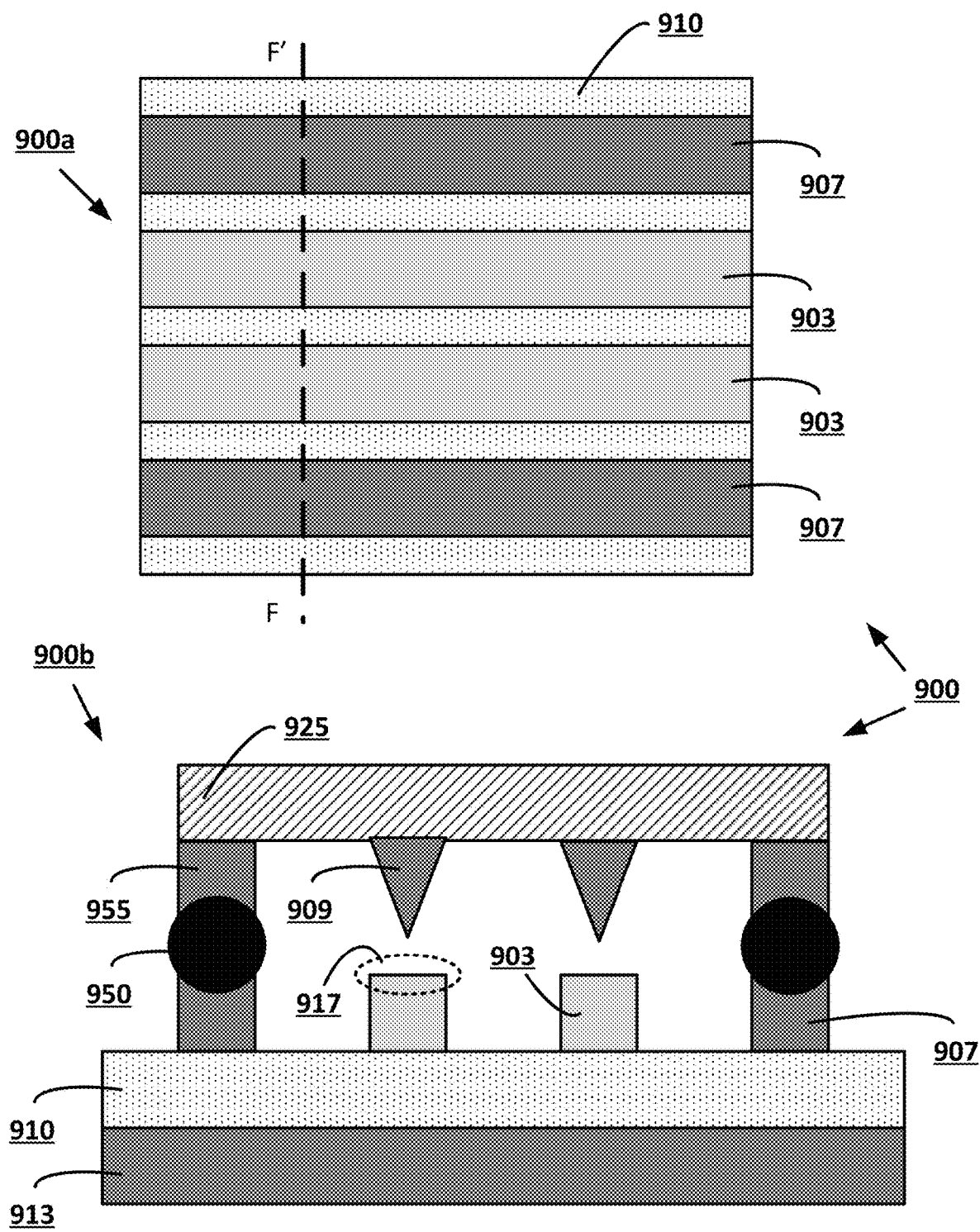
FIG. 9 depicts various simplified views of an alternative example ESD protection structure with a spark gap, in accordance with various embodiments.

Generally, the embodiments of FIGS. 3-6 depict or describe spark-gap, package substrate-integrated ESD structures which may be built into a substrate layer. FIGS. 8 and 9 depict ESD protection structures which may be built on an outer (e.g., top or bottom) layer of a package substrate such as package substrate 110. Generally, the ESD protection structure may have a structure similar to that of the embodiments of previous Figures, however in the embodiments of FIGS. 8 and 9 there may not be a package dielectric layer that covers the spark gap structures (e.g., the ground and signal contacts). Instead, the cavity may be formed by placing a lid on top of the surface of the package dielectric material (which may be, for example, a solder resist material) that is removed in the area of the spark-gap structures (for example by lithography or some other technique). The lid may have a small vertical distance to the lines or contacts which it is covering. In this manner a cavity may be formed that, while it may not be hermetic, may constrain gas expansion and ensure a relatively constant gas density in the cavity. This relatively constant gas density may ensure a relatively constant sparking voltage (e.g., $V_{trigger}$) which may be relatively temperature-independent. For example, $V_{trigger}$ may vary by approximately 10% higher or lower dependent on humidity or temperature within the cavity.

Specifically, FIG. 8 depicts two views 800a and 800b of a microelectronic package 800. View 800a may be a simplified top-down view of the microelectronic package 800 without a lid. View 800b may be a simplified cross-sectional view of the microelectronic package 800 along line E-E' of view 800a.

The microelectronic package 800 may include metal line 813, package substrate 810, signal lines 803, ground lines 807, ground contacts 809, and signal contacts 817 which may be respectively similar to, and share one or more characteristics with, metal line 313, package substrate 310, signal lines 303, ground lines 307, ground contacts 309, and signal contacts 317. Although not marked, the signal lines 803 and the ground lines 807 may be positioned a distance D apart from one another as described above with respect to FIG. 3. Although not specifically marked in FIG. 8 for the sake of lack of extra clutter of the Figure, the ground contacts 809 and the signal contacts 817 may be a distance d apart from one another, as described above with respect to previous Figures.

The microelectronic package 800 may further include a cavity 811, which may be generally similar to cavity 311. As noted above, the cavity 811 may be formed in an outer layer (e.g., a top layer or bottom layer) of the package substrate 810, for example by lithographic etching. The cavity 811 may at least partially include one or more signal line(s) 803, ground line(s) 807, ground contact(s) 809, and signal contact(s) 817 positioned therein. The cavity 811 may be sealed by a lid 825 which may be, for example, made of a material such as stainless steel. As such, the lid 825 may be an element of a package stiffener. In other embodiments, the lid may be made of copper, silicon, nickel, etc. Generally, the lid may have a thickness between approximately 50 microns and approximately 2 millimeters (mm), however in other embodiments the lid may be thicker or thinner. As noted above, the seal may not be a hermetic seal, but may be a seal that is to constrain gas expansion and ensure a constant gas density in the cavity 811.

As can be seen, the cavity 811 of FIG. 8 may include a single ground line 807 with a total of six ground contacts 809 thereon. The cavity 811 may further include at least a portion of the signal lines 803 with a total of six signal contacts 817 positioned thereon. However, it will be understood that in other embodiments the cavity 811 may include more or fewer contacts, ground lines, or signal lines. In some embodiments, one or more of the signal lines 803 may be fully inside of the cavity 811 rather than only partially within the cavity 811 as depicted in FIG. 8. In some embodiments the cavity 811 may be taller or shorter than depicted in FIG. 8. Other variations may be present in other embodiments.

FIG. 9 shows an alternative structure with a lid that plays an active role in the ESD protection structure. The lid may be communicatively or electrically coupled (e.g., by a solder joint or some other coupling) to ground or ground traces. More specifically, in some embodiments the lid may be glued (for example by an organic adhesive) to the package substrate and communicatively coupled to ground. By this coupling, the lid may have access to ground and serve at least partially as a ground line. The lid may then have spark-gap structures (e.g., ground contacts or signal contacts) that now allow for the spark to from between the lid and a signal line or signal contact. This embodiment may provide various advantages over other structures. For example, the lid may span a number of signal traces and so reduce the number of ground traces or ground structures which may be required.

Specifically, FIG. 9 depicts two views 900a and 900b of a microelectronic package 900. View 900a may be a simplified top-down view of the microelectronic package 900 without a lid. View 900b may be a simplified cross-sectional view of the microelectronic package 900 along line F-F' of view 900a.

The microelectronic package 900 may include metal line 913, package substrate 910, signal lines 903, ground lines 907, and signal contacts 917 which may be respectively similar to, and share one or more characteristics with, metal line 313, package substrate 310, signal lines 303, ground lines 307, and signal contacts 317. Although not marked, the signal lines 903 and the ground lines 907 may be positioned a distance D apart from one another, as described above with respect to FIG. 3.

As can be seen, the microelectronic package 900 may further include a lid 925, which may be similar to lid 825 of FIG. 8. However, the lid 925 may be communicatively coupled with the ground lines 907 as depicted in FIG. 9. Specifically, the lid 925 may include a standoff 955 and may be coupled with the ground lines 907 by an interconnect 950. The interconnect 950 may be similar to interconnects 115 of FIG. 1. Specifically, interconnect 950 may be a solder ball or solder bump, although in other embodiments the interconnect 950 may be some other type of interconnect.

The lid 925 may include one or more ground contacts 909 which may be generally similar to ground contacts 309 or some other type of ground contact. Although not specifically marked for the sake of lack of redundancy of the Figure, the ground contacts 909 may be separated from the signal contacts 917 by a distance d, which may be similar to the distance d discussed above with respect to FIG. 3. As can be seen, the ground contacts 909 may protrude from the lid 925 into the cavity 911 that is formed by the package substrate 910, the lid 925, the ground lines 907, the interconnects 950, and the standoff 955. Additionally, as may be understood, the ground contacts 909 may be communicatively coupled with the ground trace 907 through one or more traces, pads, vias, or some other conductive element either within, or on the surface of, the lid 925. Specifically, the ground contacts 909 may be communicatively coupled with the ground trace 907 through the one or more conductive elements, the standoff 955, and the interconnect 950. The conductive elements are not shown in FIG. 9 for the sake of avoidance of clutter of the Figure.

The standoff 955 may be included in the microelectronic package 900 to help adjust the size or volume of the cavity 911, adjust the distance d of the ground contacts 909 from the signal contacts 917, or for some other reason. As noted, the distance of the ground contacts 909 from the signal contacts 917, the relative pressure or size of the cavity 911, or other factors may alter the trigger voltage $V_{trigger}$ at which a spark may arc between the ground contacts 909 and the signal contacts 917.

As can be seen in FIG. 9, the microelectronic package 900 may provide a number of advantages. For example, the lid 925 may include a plurality of ground contacts 909 within the cavity, and respective ones of the ground contacts 909 may be adjacent to a signal contact 917 of a signal line 903 that is within the cavity 911. This configuration may allow for scalability of the microelectronic package such that more or fewer signal lines 903 may be positioned within the cavity 911.

Similarly to other embodiments, it will be understood that the embodiments of FIGS. 8 and 9 are intended as sample embodiments and other embodiments may vary. For example, other embodiments may have elements (e.g., the contacts or lines) that are a different size or shape than depicted as is described above with respect to FIGS. 3-6. In some embodiments, the lid 925 may be coupled with the signal lines rather than the ground lines, and therefore may include signal contacts rather than ground contacts. Other variations may be present in other embodiments.

It will be understood that the spark gap ESD protection structures may be built on various layers of the package substrate. For example, FIGS. 2-6 show inner-layer type configurations of the ESD protections structure, and FIGS. 8 and 9 show outer-layer type configurations of the ESD protection structures. However, in some embodiments signal may move vertically through the package substrate. For example, when transitioning from one package layer to another package layer, the signal may need to be routed out of the package substrate. In this case, the via may land on a pad within a layer of the package substrate. The signal pads may be surrounded by a ground line or a ground layer, which may have spark gap structures that radially surround the signal via.

Figure 10:
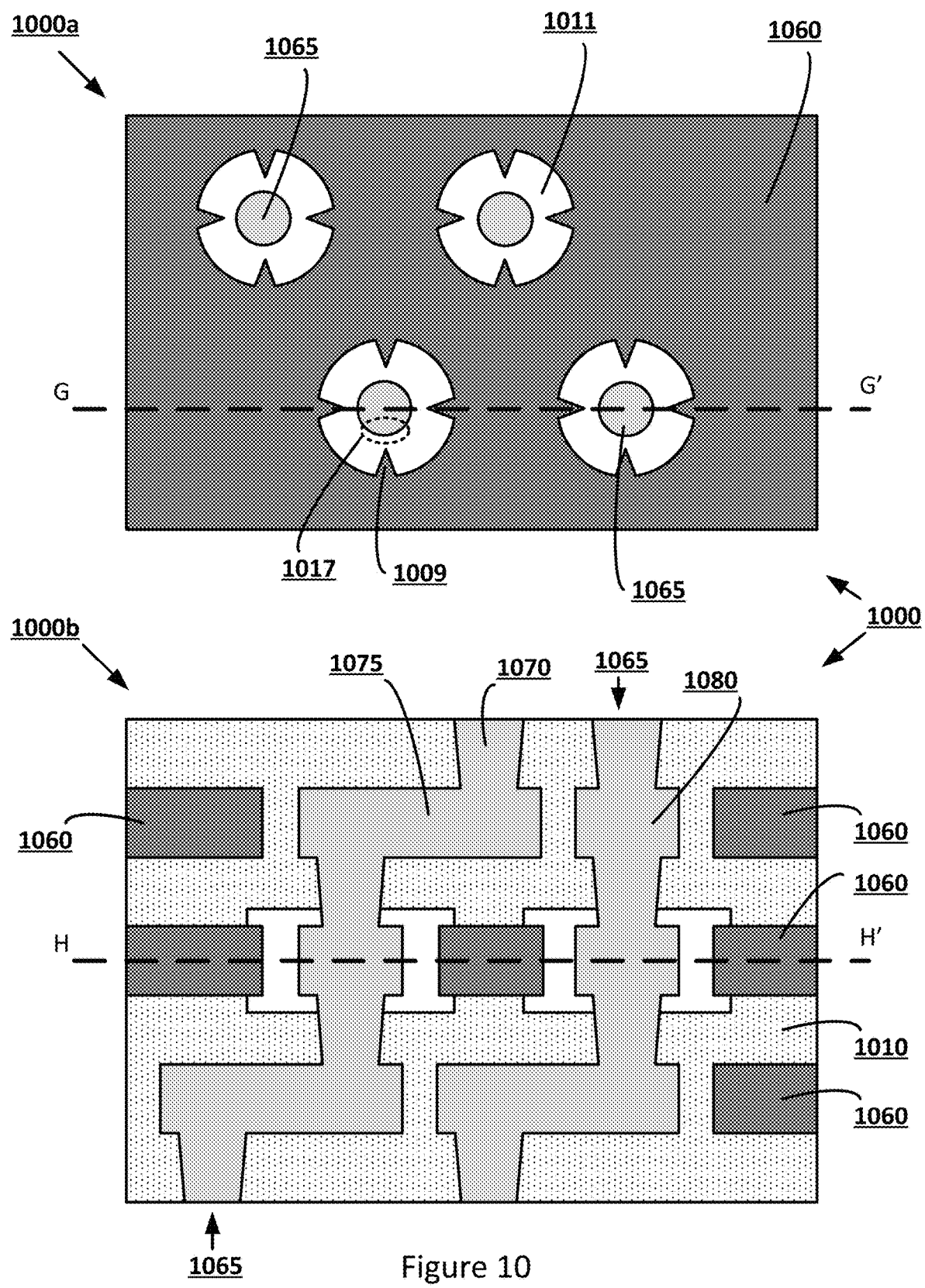
FIG. 10 depicts various simplified views of an alternative example ESD protection structure with a spark gap, in accordance with various embodiments.

Specifically, FIG. 10 depicts two views 1000a and 1000b of a microelectronic package 1000. View 1000a may be a simplified top-down view of the microelectronic package 1000 without a lid. View 1000b may be a simplified cross-sectional view of the microelectronic package 1000 along line G-G' of view 1000a. Similarly, view 1000a may be a simplified cross-sectional view of the microelectronic package 1000 along line H-H' of view 1000b.

The microelectronic package 1000 may include a package substrate 1010, which may be similar to package substrate 310 of FIG. 3. The package substrate 1010 may have a number of signal lines 1065 therein that go between different layers of the package substrate. The signal lines 1065 may be made up of a number of conductive elements such as vias 1070, pads 1080, and traces 1075.

The package substrate 1010 may further include a number of metal layers 1060. One or more of the metal layers 1060 may be coupled with ground of the microelectronic package 1000, or an electronic device of which the microelectronic package 1000 is a part. In the specific embodiment of FIG. 10, the metal layer 1060 that is colinear with line H-H' may be coupled with ground and therefore serve a function similar to that of the ground line 307 (or some other ground line) described above. It will be understood that although the metal layer 1060 is depicted in view 1000a as a unitary piece of metal, in other embodiments the metal layer 1060 may include a plurality of pieces that are either coupled with one another or separated from one another.

The metal layer may include one or more protrusions, which may serve as ground contacts 1009 that are similar to ground contacts 309 (or some other ground contact) described above. Specifically, the signal line 1065 may include a signal contact 1017 that is adjacent to the ground contact 1009. The signal contact 1017 and the ground contact 1009 may be positioned in a cavity 1011, which may be similar to cavity 311 or some other cavity described herein, and may be a distance d apart from one another as described above (although not specifically depicted in FIG. 10 for the sake of lack of redundancy of the Figure). As described with respect to other embodiments, when the voltage $V_{in}$ of the signal line 1065 is at or above a trigger voltage $V_{trigger}$, excess voltage may arc between the ground contact 1009 and the signal contact 1017 within the cavity 1011.

Similarly to other embodiments, it will be understood that the embodiment of FIG. 10 is intended as an example embodiment, and other embodiments may vary from that depicted. For example, the shape of the signal lines 1065 (or elements thereof), the configuration of the specific lines or traces, the shape, number, or size of various contacts, etc. may vary in different embodiments in some embodiments, rather than extending above and below the metal layer 1060, the cavity 1011 may be flush with, or even slightly below or above, the top or bottom of the metal layer 1060. In some embodiments the metal layer 1060 may be a signal layer or trace, and the element marked "signal line 1065" may instead be coupled to ground. In some embodiments, the signal line 1065 may have protruding contacts while the metal layer 1060 does not (or both or neither may have protruding contacts). Other embodiments may have other variations.

Figure 11:
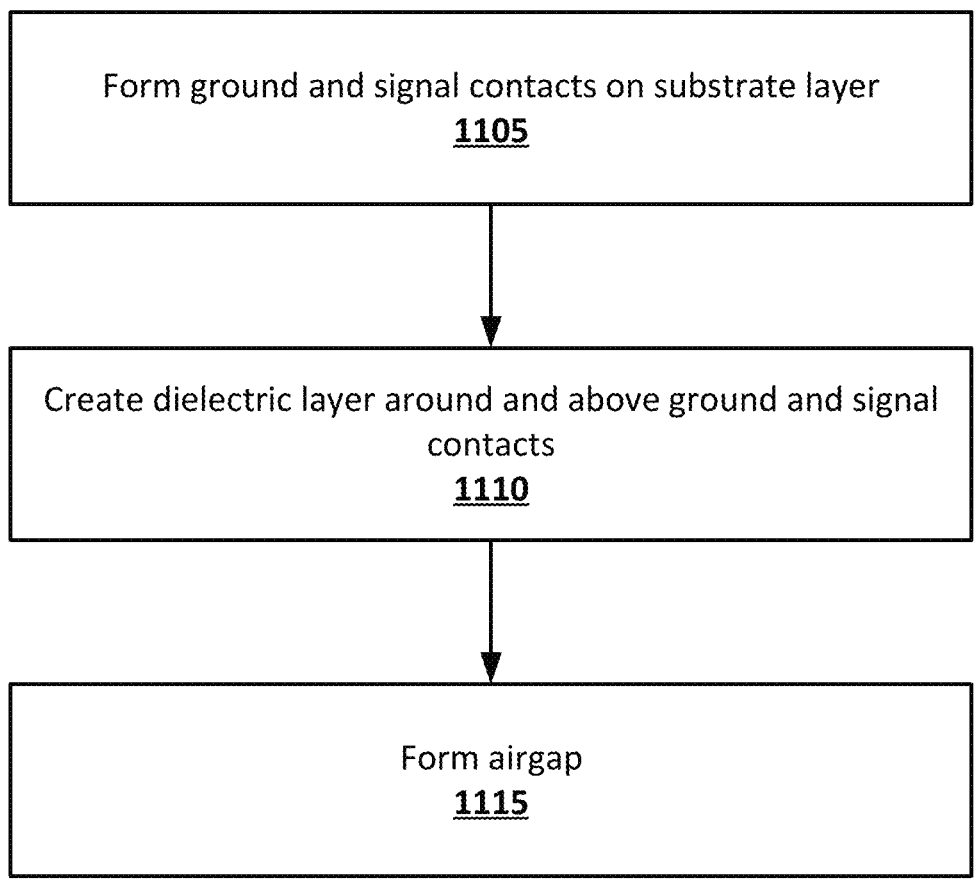
FIG. 11 depicts an example technique for the manufacture of a microelectronic package with an ESD protection structure with a spark gap, in accordance with various embodiments.

FIG. 11 depicts an example technique for the manufacture of a microelectronic package with an ESD protection structure with a spark gap, in accordance with various embodiments. Generally, the technique may be described with respect to elements of FIG. 11, however it will be understood that the technique may be applicable, in whole or in part, with or without modification, to elements of other embodiments.

Generally, the process flow may be related to a manufacturing flow of a package substrate layer. Once the metal layer on top of the areas with the cavity is formed, the buildup film underneath the metal layer may be removed by reactive ion etch. For this reason, the top metal layer may include openings that allow for the plasma to reach the buildup film, and remove the film. Another way of forming the cavity may be performed by using a sacrificial material that, after building up metal and dielectric layers above, can be thermally removed as it will decompose at elevated temperatures and diffuse through the layers above.

The technique may include forming, at 1105, ground and signal contacts on a substrate layer. The ground and signal contacts may be similar to, for example, ground contacts 309 and signal contacts 317. The substrate layer may be a layer of substrate 310, or some other substrate layer. Forming the contacts may include lithographic printing, etching, deposition, or some other technique or combination thereof.

The technique may further include creating, at 1110, a dielectric layer around and above the ground and signal contacts. Specifically, the dielectric layer may be the dielectric material of the package substrate 310. The dielectric layer may be created around and above the ground and signal contacts through deposition, lamination, etc.

The technique may then include forming, at 1115, the cavity such as cavity 311. As noted above, the cavity may be formed by placing a metal layer above the layer that is to include the cavity, and then performing reactive ion etching to remove at least a part of the dielectric material and expose the ground and signal contacts within the cavity. However, in other embodiments forming the cavity may be done in a different manner, for example by photo or mechanical etching, the use of a sacrificial material that is then removed, or some other manner.

It will be understood that the above embodiment of the technique is one example technique, and other embodiments may have more or fewer elements, elements in a different order than depicted, etc. For example, for structures with a lid (e.g., the embodiments of FIG. 8 or 9), the manufacturing process may be simpler because the top dielectric may be photo-definable, and a mask change may allow for the removal of the top dielectric by lithographic patterning and development, which may form a cavity that may be covered by a lid. Other manufacturing process flows used to manufacture airgaps may be adapted as well.

Additionally, because the actual air gaps may be relatively small, it may also be possible to manufacture the airgaps without additional processing. Specifically, because a dry film may be applied as the dielectric by lamination, an effect known as tenting (i.e., the buildup dielectric film does not squeeze all the way between two adjacent metal structures if they are too close or the film is too thick) may occur, so it may be possible to create the air gaps by proper design of the structures.

Figure 12:
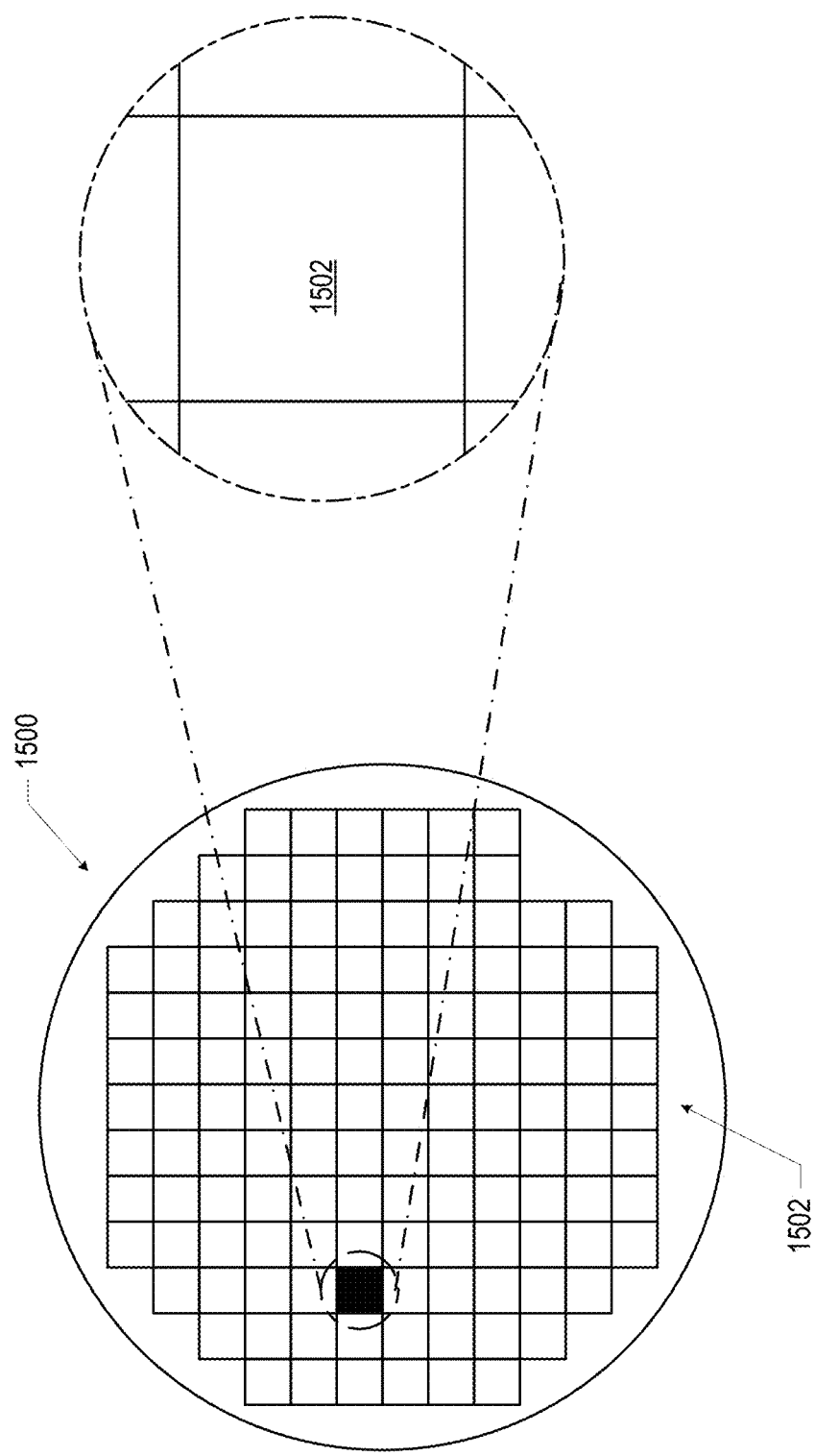
FIG. 12 is a top view of a wafer and dies that may include an ESD protection structure with a spark gap, in accordance with various embodiments.

FIG. 12 is a top view of a wafer 1500 and dies 1502 that may include one or more ESD protection structure with a spark gap, or may be included in an IC package including one or more ESD protection structure with a spark gap in accordance with various embodiments. The wafer 1500 may be composed of semiconductor material and may include one or more dies 1502 having IC structures formed on a surface of the wafer 1500. Each of the dies 1502 may be a repeating unit of a semiconductor product that includes a suitable IC. After the fabrication of the semiconductor product is complete, the wafer 1500 may undergo a singulation process in which the dies 1502 are separated from one another to provide discrete "chips" of the semiconductor product. The die 1502 may include one or more ESD protection structure with a spark gap, one or more transistors or supporting circuitry to route electrical signals to the transistors, or some other IC component. In some embodiments, the wafer 1500 or the die 1502 may include a memory device (e.g., a random-access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 14) or other logic that is configured to store information in the memory devices or execute instructions stored in the memory array.

Figure 13:
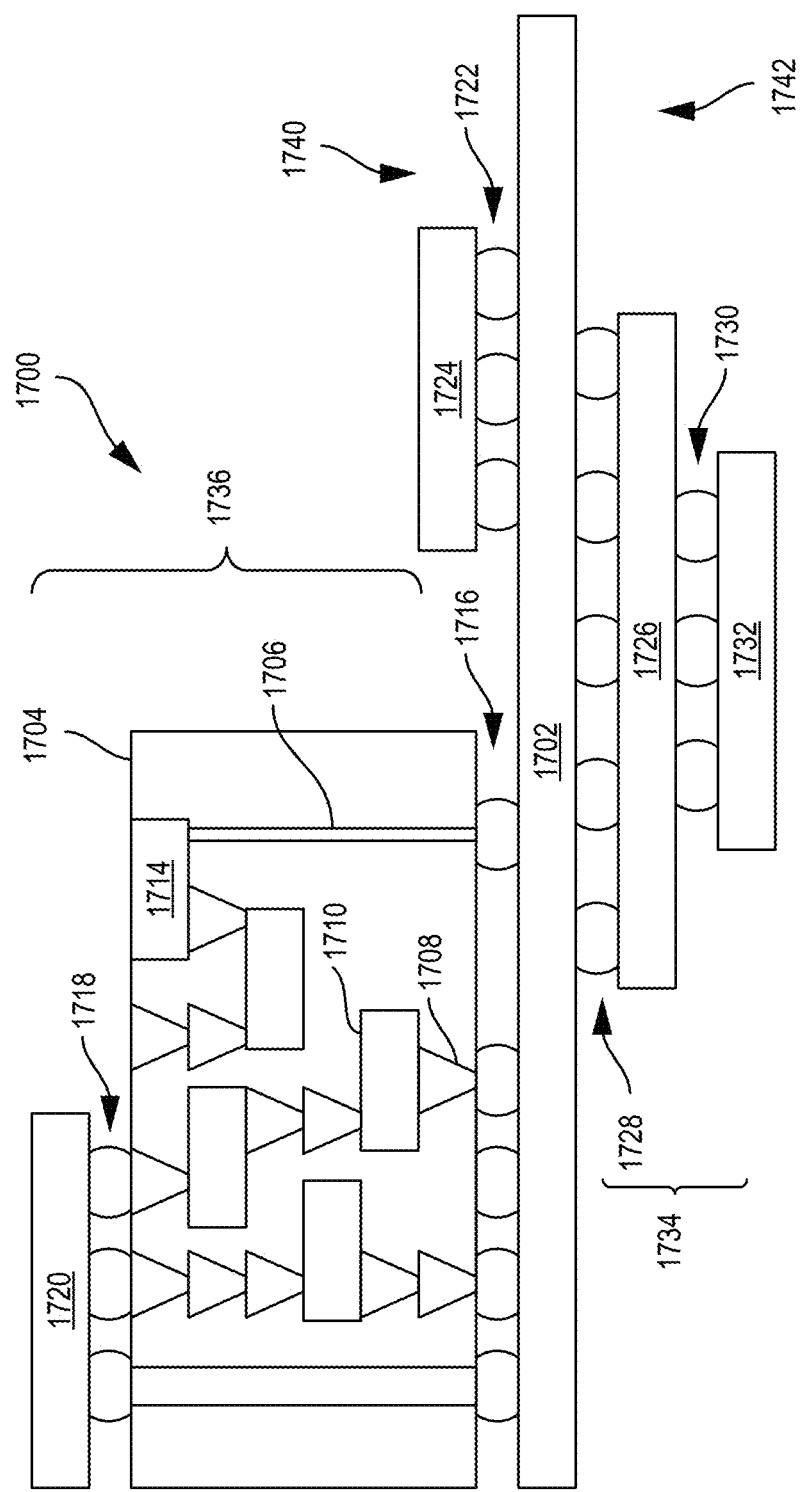
FIG. 13 is a side, cross-sectional view of an IC device assembly that may include an ESD protection structure with a spark gap, in accordance with various embodiments.

FIG. 13 is a side, cross-sectional view of an IC device assembly 1700 that may include one or more IC packages or other electronic components (e.g., a die) including one or more ESD protection structure with a spark gap, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 13 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 13), male and female portions of a socket, an adhesive, an underfill material, and/or any other suitable electrical and/or mechanical coupling structure.

The package-on-interposer structure 1736 may include an IC package 1720 coupled to a package interposer 1704 by coupling components 1718. The coupling components 1718 may take any suitable form for the application, such as the forms discussed above with reference to the coupling components 1716. Although a single IC package 1720 is shown in FIG. 13, multiple IC packages may be coupled to the package interposer 1704; indeed, additional interposers may be coupled to the package interposer 1704. The package interposer 1704 may provide an intervening substrate used to bridge the circuit board 1702 and the IC package 1720. The IC package 1720 may be or include, for example, a die (the die 1502 of FIG. 12), an IC device, or any other suitable component. Generally, the package interposer 1704 may spread a connection to a wider pitch or reroute a connection to a different connection. For example, the package interposer 1704 may couple the IC package 1720 (e.g., a die) to a set of BGA conductive contacts of the coupling components 1716 for coupling to the circuit board 1702. In the embodiment illustrated in FIG. 13, the IC package 1720 and the circuit board 1702 are attached to opposing sides of the package interposer 1704; in other embodiments, the IC package 1720 and the circuit board 1702 may be attached to a same side of the package interposer 1704. In some embodiments, three or more components may be interconnected by way of the package interposer 1704.

In some embodiments, the package interposer 1704 may be formed as a PCB, including multiple metal layers separated from one another by layers of dielectric material and interconnected by electrically conductive vias. In some embodiments, the package interposer 1704 may be formed of an epoxy resin, a fiberglass-reinforced epoxy resin, an epoxy resin with inorganic fillers, a ceramic material, or a polymer material such as polyimide. In some embodiments, the package interposer 1704 may be formed of alternate rigid or flexible materials that may include the same materials described above for use in a semiconductor substrate, such as silicon, germanium, and other group III-V and group IV materials. The package interposer 1704 may include metal lines 1710 and vias 1708, including but not limited to through-silicon vias (TSVs) 1706. The package interposer 1704 may further include embedded devices 1714, including both passive and active devices. Such devices may include, but are not limited to, capacitors, decoupling capacitors, resistors, inductors, fuses, diodes, transformers, sensors, ESD devices, and memory devices. More complex devices such as RF devices, power amplifiers, power management devices, antennas, arrays, sensors, and microelectromechanical systems (MEMS) devices may also be formed on the package interposer 1704. The package-on-interposer structure 1736 may take the form of any of the package-on-interposer structures known in the art. In some embodiments, the package interposer 1704 may include one or more ESD protection structure with a spark gap.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 13 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 14:
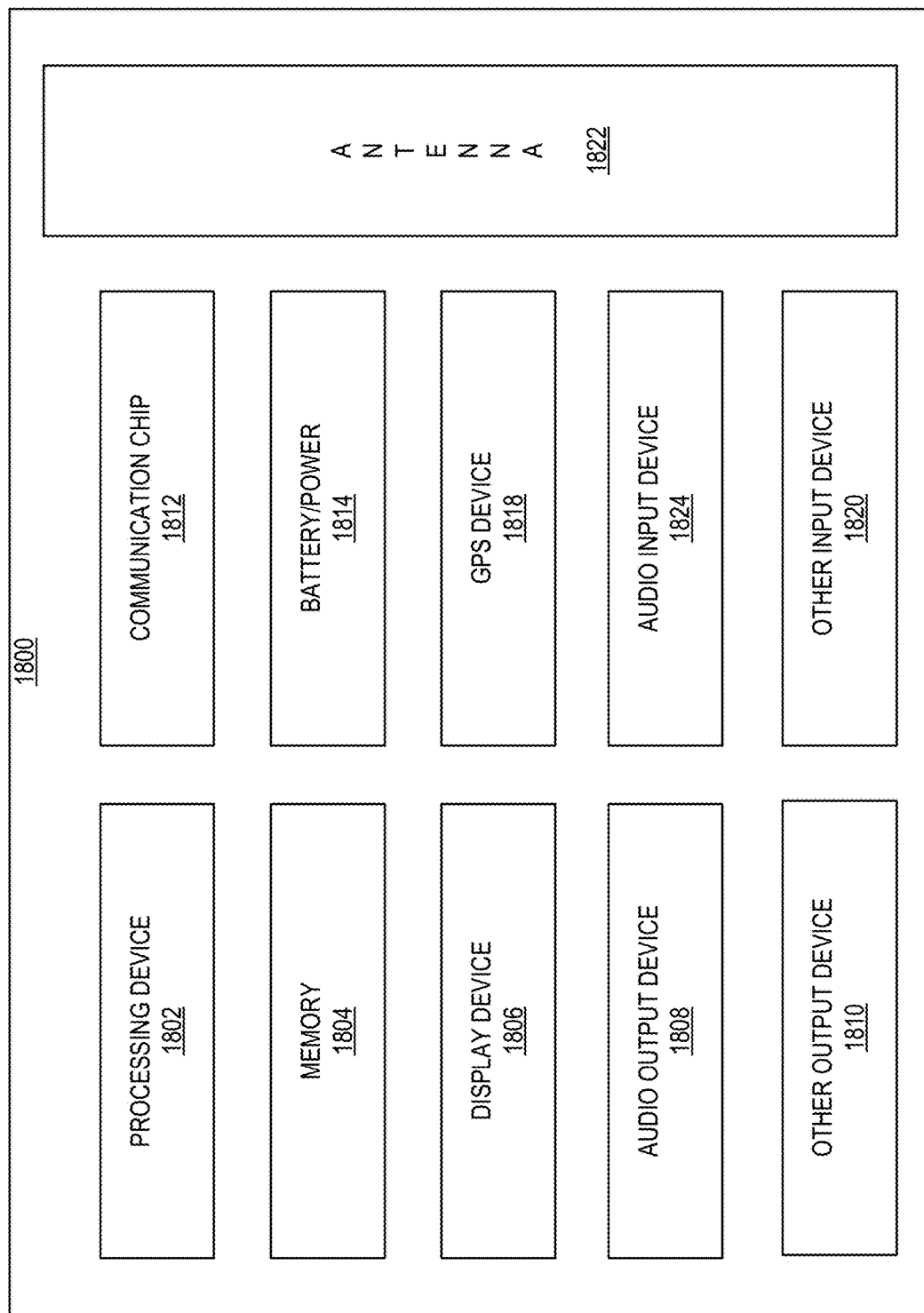
FIG. 14 is a block diagram of an example electrical device that may include an ESD protection structure with a spark gap, in accordance with various embodiments.

FIG. 14 is a block diagram of an example electrical device 1800 that may include one or more ESD protection structure with a spark gap, in accordance with any of the embodiments disclosed herein. For example, any suitable ones of the components of the electrical device 1800 may include one or more of the IC device assemblies 1700, IC packages, IC devices, or dies 1502 disclosed herein. A number of components are illustrated in Figure X3 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 14, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), ASICs, CPUs, GPUs, cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random-access memory (DRAM)), nonvolatile memory (e.g., ROM), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include another output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include another input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

EXAMPLES OF VARIOUS EMBODIMENTS

Example 1 includes a microelectronic package comprising: a package substrate with a signal line and a ground line; and an ESD protection structure within the package substrate; wherein the ESD protection structure includes a cavity in a layer of the package substrate; wherein a contact of the signal line and a contact of the ground line are within the cavity and separated by a distance d; and wherein a charge is to transfer between the contact of the signal line and the contact of the ground line when a charge difference between the contact of the signal line and the contact of the ground line is above a charge threshold.

Example 2 includes the microelectronic package of example 1, wherein the contact of the signal line is a protrusion from the signal line.

Example 3 includes the microelectronic package of example 1, wherein the contact of the ground line is a protrusion from the ground line.

Example 4 includes the microelectronic package of example 1, wherein the ESD protection structure includes a plurality of contacts of the signal line and a plurality of contacts of the ground line positioned within the cavity.

Example 5 includes the microelectronic package of any of examples 1-4, wherein the ESD protection structure further includes a second cavity in the layer of the package substrate, and wherein a second contact of the signal line and a second contact of the ground line are within the second cavity.

Example 6 includes the microelectronic package of any of examples 1-4, wherein the signal line is a via in the package substrate.

Example 7 includes the microelectronic package of any of examples 1-4, wherein the distance d is between 0.5 micrometers ("microns") and 5 microns.

Example 8 includes a microelectronic package comprising: a package substrate with a cavity in a face of the package substrate; a lid positioned over the cavity, wherein the lid provides an airtight seal to the cavity; and an ESD apparatus positioned within the cavity, wherein the ESD apparatus includes a contact of a signal line and a contact of a ground line separated by a distance d that is based on a desired voltage of a spark gap between the contact of the signal line and the contact of the ground line.

Example 9 includes the microelectronic package of example 8, wherein the contact of the signal line and the contact of the ground line are elements of a layer of the package substrate.

Example 10 includes the microelectronic package of example 8, wherein the lid is communicatively coupled with a ground of the microelectronic package.

Example 11 includes the microelectronic package of example 10, wherein the contact of the ground line is an element of the lid.

Example 12 includes the microelectronic package of example 11, wherein the lid comprises a second contact of the ground line that is separated by the distance d from a contact of a second signal line.

Example 13 includes the microelectronic package of any of examples 8-12, further comprising a lid standoff between the lid and the package substrate, and wherein a z-height of the lid standoff is based on a desired value for the distance d.

Example 14 includes the microelectronic package of any of examples 8-12, wherein the desired voltage is between 4 volts (V) and 5 V.

Example 15 includes a microelectronic package comprising: a package substrate with a signal line coupled with a signal pad of the microelectronic package; a die communicatively coupled with the signal line; a ground line positioned between a ground pad of the microelectronic package and the signal line; and an ESD protection structure within the ground line, wherein the ESD protection structure includes a ground contact communicatively coupled with the ground pad and a signal contact communicatively coupled with the signal line, wherein the ground contact and the signal contact are separated by a distance d that is based on a desired spark gap of the ESD protection structure.

Example 16 includes the microelectronic package of example 15, wherein the ground contact or the signal contact have a rounded profile.

Example 17 includes the microelectronic package of example 15, wherein the ground contact or the signal contact have a pointed profile.

Example 18 includes the microelectronic package of example 15, wherein the ground contact or the signal contact have a squared profile.

Example 19 includes the microelectronic package of any of examples 15-18, wherein the distance d is between 0.5 micrometers ("microns") and 5 microns.

Example 20 includes the microelectronic package of any of examples 15-18, wherein the distance d is between 1 micrometer ("micron") and 2 microns.

Example 21 includes a microelectronic package comprising: a package substrate with a signal line and a ground line; and an electrostatic discharge (ESD) protection structure within the package substrate; wherein the ESD protection structure includes a cavity in a layer of the package substrate; wherein a contact of the signal line and a contact of the ground line are within the cavity and separated by a distance d; and wherein the signal line and the ground line are at least partially within the cavity and, within the cavity, are separated by a distance D that is greater than the distance d.

Example 22 includes the microelectronic package of example 21, wherein the contact of the signal line is a protrusion from the signal line or the contact of the ground line is a protrusion from the ground line.

Example 23 includes the microelectronic package of example 21, wherein a charge is to transfer between the contact of the signal line and the contact of the ground line when a charge difference between the contact of the signal line and the contact of the ground line is above a charge threshold.

Example 24 includes the microelectronic package of example 21, wherein the ESD protection structure includes a plurality of contacts of the signal line and a plurality of contacts of the ground line positioned within the cavity.

Example 25 includes the microelectronic package of any of examples 21-24, wherein the ESD protection structure further includes a second cavity in the layer of the package substrate, and wherein a second contact of the signal line and a second contact of the ground line are within the second cavity.

Example 26 includes the microelectronic package of any of examples 21-24, wherein the signal line is a via in the package substrate.

Example 27 includes the microelectronic package of any of examples 21-24, wherein the distance d is between 0.5 micrometers ("microns") and 5 microns.

Example 28 includes a microelectronic package comprising: a package substrate with a cavity in a face of the package substrate; a lid positioned over the cavity, wherein the lid provides an airtight seal to the cavity; and an electrostatic discharge (ESD) apparatus positioned within the cavity, wherein the ESD apparatus includes a spark gap with a contact of a signal line and a contact of a ground line separated by a distance d.

Example 29 includes the microelectronic package of example 28, wherein the contact of the signal line and the contact of the ground line are elements of a layer of the package substrate.

Example 30 includes the microelectronic package of example 28, wherein the lid is communicatively coupled with a ground of the microelectronic package.

Example 31 includes the microelectronic package of example 30, wherein the contact of the ground line is an element of the lid.

Example 32 includes the microelectronic package of example 31, wherein the lid comprises a second contact of the ground line that is separated by the distance d from a contact of a second signal line.

Example 33 includes the microelectronic package of any of examples 28-32, further comprising a lid standoff between the lid and the package substrate, and wherein a z-height of the lid standoff is based on a desired value for the distance d.

Example 34 includes the microelectronic package of any of examples 28-32, wherein the distance d is based on a desired voltage of the spark gap, and wherein the desired voltage is between 4 volts (V) and 5 V.

Example 35 includes a microelectronic package comprising: a package substrate with a signal line coupled with a signal pad of the microelectronic package; a die communicatively coupled with the signal line; a ground line positioned between a ground pad of the microelectronic package and the signal line; and an electrostatic discharge (ESD) protection structure within the ground line, wherein the ESD protection structure includes a ground contact communicatively coupled with the ground pad and a signal contact communicatively coupled with the signal line, and wherein the ground contact and the signal contact have a spark gap therebetween.

Example 36 includes the microelectronic package of example 35, wherein the ground contact or the signal contact have a rounded profile.

Example 37 includes the microelectronic package of example 35, wherein the ground contact or the signal contact have a pointed profile.

Example 38 includes the microelectronic package of example 35, wherein the ground contact or the signal contact have a squared profile.

Example 39 includes the microelectronic package of any of examples 35-38, wherein the ground contact and the signal contact are separated by a distance d that is between 0.5 micrometers ("microns") and 5 microns.

Example 40 includes the microelectronic package of any of examples 35-38, wherein the ground contact and the signal contact are separated by a distance d that is between 1 micrometer ("micron") and 2 microns.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or limiting as to the precise forms disclosed. While specific implementations of, and examples for, various embodiments or concepts are described herein for illustrative purposes, various equivalent modifications may be possible, as those skilled in the relevant art will recognize. These modifications may be made in light of the above detailed description, the Abstract, the Figures, or the claims.

The invention claimed is:

1. A microelectronic package comprising:
a package substrate with a signal line and a ground line; and
an electrostatic discharge (ESD) protection structure within the package substrate;
wherein the ESD protection structure includes a cavity in a layer of the package substrate;
wherein a contact of the signal line and a contact of the ground line are within the cavity and separated by a distance d, wherein the distance d is based on a desired voltage of the spark gap, and wherein the desired voltage is between 2 volts (V) and 10 V; and
wherein the signal line and the ground line are at least partially within the cavity and, within the cavity, are separated by a distance D that is greater than the distance d.

2. The microelectronic package of claim 1, wherein the contact of the signal line is a protrusion from the signal line or the contact of the ground line is a protrusion from the ground line.

3. The microelectronic package of claim 1, wherein a charge is to transfer between the contact of the signal line and the contact of the ground line when a charge difference between the contact of the signal line and the contact of the ground line is above a charge threshold.

4. The microelectronic package of claim 1, wherein the ESD protection structure includes a plurality of contacts of the signal line and a plurality of contacts of the ground line positioned within the cavity.

5. The microelectronic package of claim 1, wherein the ESD protection structure further includes a second cavity in the layer of the package substrate, and wherein a second contact of the signal line and a second contact of the ground line are within the second cavity.

6. The microelectronic package of claim 1, wherein the signal line is a via in the package substrate.

7. The microelectronic package of claim 1, wherein the distance d is between 0.5 micrometers ("microns") and 5 microns.

8. A microelectronic package comprising:
a package substrate with a cavity in a face of the package substrate;
a lid positioned over the cavity, wherein the lid provides an airtight seal to the cavity;
an electrostatic discharge (ESD) apparatus positioned within the cavity, wherein the ESD apparatus includes a spark gap with a contact of a signal line and a contact of a ground line separated by a distance d; and
a lid standoff between the lid and the package substrate, wherein a z-height of the lid standoff is based on a desired value for the distance d.

9. The microelectronic package of claim 8, wherein the contact of the signal line and the contact of the ground line are elements of a layer of the package substrate.

10. The microelectronic package of claim 8, wherein the lid is communicatively coupled with a ground of the microelectronic package.

11. The microelectronic package of claim 10, wherein the contact of the ground line is an element of the lid.

12. The microelectronic package of claim 11, wherein the lid comprises a second contact of the ground line that is separated by the distance d from a contact of a second signal line.

13. The microelectronic package of claim 8, wherein the distance d is based on a desired voltage of the spark gap, and wherein the desired voltage is between 2 volts (V) and 10 V.

14. The microelectronic package of claim 8, wherein the distance d is based on a desired voltage of the spark gap, and wherein the desired voltage is between 4 volts (V) and 5 V.

15. A microelectronic package comprising:
a package substrate with a signal line coupled with a signal pad of the microelectronic package;
a die communicatively coupled with the signal line;
a ground line positioned between a ground pad of the microelectronic package and the signal line; and
an electrostatic discharge (ESD) protection structure within the ground line, wherein the ESD protection structure includes a ground contact communicatively coupled with the ground pad and a signal contact communicatively coupled with the signal line, and wherein the ground contact and the signal contact have a spark gap therebetween and are separated by a distance d, wherein the distance d is based on a desired voltage of the spark gap, and wherein the desired voltage is between 2 volts (V) and 10 V.

16. The microelectronic package of claim 15, wherein the ground contact or the signal contact have a rounded profile.

17. The microelectronic package of claim 15, wherein the ground contact or the signal contact have a pointed profile.

18. The microelectronic package of claim 15, wherein the ground contact or the signal contact have a squared profile.

19. The microelectronic package of claim 15, wherein the distance d that is between 0.5 micrometers ("microns") and 5 microns.

20. The microelectronic package of claim 15, wherein the distance d that is between 1 micrometer ("micron") and 2 microns.

\* \* \* \* \*

UNITED STATES PATENT AND TRADEMARK OFFICE
CERTIFICATE OF CORRECTION

PATENT NO. : 11,348,882 B2
APPLICATION NO. : 16/683125
DATED : May 31, 2022
INVENTOR(S) : Aleksandar Aleksov et al.

It is certified that error appears in the above-identified patent and that said Letters Patent is hereby corrected as shown below:

In the Claims

In Column 23, Claim 19, Line 2, delete "that is" and insert -- is --, therefor.

In Column 23, Claim 20, Line 5, delete "that is" and insert -- is --, therefor.

Signed and Sealed this
Twenty-eighth Day of February, 2023

Katherine Kelly Vidal
*Director of the United States Patent and Trademark Office*